United States Patent
Lou

(10) Patent No.: US 12,255,113 B2
(45) Date of Patent: Mar. 18, 2025

(54) ALIGNMENT METHOD AND ALIGNMENT DEVICE

(71) Applicant: STAR TECHNOLOGIES (WUHAN) CO., LTD., Wuhan (CN)

(72) Inventor: Choon Leong Lou, Singapore (SG)

(73) Assignee: STAR TECHNOLOGIES (WUHAN) CO., LTD., Wuhan (CN)

( * ) Notice: Subject to any disclaimer, the term of this patent is extended or adjusted under 35 U.S.C. 154(b) by 128 days.

(21) Appl. No.: 18/189,335

(22) Filed: Mar. 24, 2023

(65) Prior Publication Data

US 2024/0096716 A1 Mar. 21, 2024

(30) Foreign Application Priority Data

Sep. 21, 2022 (CN) .......................... 202211166169.5

(51) Int. Cl.
*G01R 31/28* (2006.01)
*H01L 21/66* (2006.01)

(52) U.S. Cl.
CPC .......... *H01L 22/32* (2013.01); *G01R 31/2887* (2013.01); *H01L 22/12* (2013.01); *H01L 22/14* (2013.01); *H01L 22/34* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| | | | |
|---|---|---|---|
| 2007/0170937 A1* | 7/2007 | Endou | G01R 31/2891 324/754.03 |
| 2007/0229098 A1* | 10/2007 | Kobayashi | G01R 31/2891 324/750.23 |
| 2011/0304857 A1* | 12/2011 | Liu | G01N 21/95607 356/601 |

FOREIGN PATENT DOCUMENTS

| | | |
|---|---|---|
| TW | 200826175 A | 6/2008 |
| TW | 201314812 A1 | 4/2013 |

OTHER PUBLICATIONS

Taiwan Patent Office, Office action issued on Sep. 8, 2023.

* cited by examiner

*Primary Examiner* — Tung X Nguyen
(74) *Attorney, Agent, or Firm* — Li & Cai Intellectual Property (USA) Office

(57) ABSTRACT

An alignment method and an alignment device thereof are provided. The alignment method includes: providing a wafer including wafer coordinate information. Two probes are respectively aligned with two bonding pads on a dicing road of the wafer, and an image capture device is used to assist the two probes to obtain actual wafer information. The wafer coordinate information is then compared with the actual wafer information to determine whether the two probes are accurately aligned with the two bonding pads on the dicing road, respectively. When an alignment position of the two probes is determined, the positions of any chips and bonding pads on the wafer can be determined.

7 Claims, 7 Drawing Sheets

ALIGNMENT METHOD AND ALIGNMENT DEVICE

FIELD OF THE DISCLOSURE

The present disclosure relates to an alignment method and an alignment device, and more particularly to an alignment method and an alignment device used on a wafer.

BACKGROUND OF THE DISCLOSURE

When a semiconductor chip is tested, a testing device is electrically connected to a test object to be tested through a probe card, so to obtain the test result of the test object to be tested by signal transmission and signal analysis. The probe card usually includes a circuit board and a probe device (i.e., a probe head), or further includes a space converter (i.e., a carrier board) between the circuit board and the probe device. The probe device is provided with a plurality of probes that are arranged corresponding to the electrical contacts of the test object, so that the probes can simultaneously contact corresponding ones of the electrical contacts.

However, the sizes of conventional chips and conventional electrical contacts (i.e., a pad, or a bonding pad) are getting smaller and smaller, so that scratches on the electrical contacts have exceeded the preset range or depth by any test, and increase resistance during subsequent wire bonding. When the alignment between the probe head and a test point of the wafer is not accurate enough, the scratches on the electrical contacts of the wafer are not in a preset region. Although in the prior art, testers have been inspected by naked eyes or optical image recognition to determine whether the probe head and the test point of the wafer are correctly aligned. However, in this method, a vertical image of the probe and the electrical contacts overlaps and is not easy to align because the size of the wafer and the area of the electrical contacts are reduced, and the arrangement of the chip and the electrical contacts is also denser. In order to solve the problem that a resistance of wire bonding caused by the scratches on the electrical contacts increases, it has gradually become a trend that the test region of the wafer is limited to the partial area (e.g., 50%) on the electrical contacts, which makes it more difficult to achieve the alignment of the probes and the electrical contacts.

In addition, in the prior art, most of the industry additionally adds an auxiliary alignment element on the wafer to improve the precision of the probe head. However, this method is not only time-consuming but also generates many additional unnecessary installation costs.

On the other hand, currently in the industry, a wafer acceptance test (WAT) is implemented on the wafer before the wafer process to confirm whether the wafer is qualified. More precisely, after the wafer acceptance test is implemented on the test keys on the wafer. However, the test keys on the wafer have no function, which is a waste.

Therefore, under the premise of not installing additional auxiliary alignment components, how to overcome the above-mentioned defects by improving the structural design to reduce the scratches of the electrical contacts on the wafer caused by the wrong alignment and improve the accurate alignment at the same time, so that the probe can be reduced in size and the test region and the probe can be accurately aligned, which has become one of the important issues that the business wants to solve.

SUMMARY OF THE DISCLOSURE

In response to the above-referenced technical inadequacies, the present disclosure provides a an alignment method that can effectively make the probe head align the test region on the test point of the wafer (i.e., the bonding pad) to ensure that a scratch range caused by the test is limited to the predetermined test region. Accordingly, the alignment method can avoid scratches outside the predetermined test region to reduce the resistance during subsequent wire bonding. In addition, the test keys on the wafer is used as an alignment aid, so that the probe head can be effectively aligned and pinned to a specific position on the wafer.

In one aspect, the present disclosure provides an alignment method. The alignment method is used to perform alignment of a plurality of probes with a wafer that includes a plurality of chips. Any two of the chips adjacent to each other have a dicing road there-between, the dicing road has a plurality of test keys, and the wafer has wafer coordinate information. The alignment method includes: providing a probe card having at least two probes. Two probes are configured to respectively align one of the test keys located on any two of dicing roads. The alignment method also includes: providing an image capture device to capture and obtain a plurality of relative positions between the two probes and two of the test keys. When the two probes and the two test keys are determined to be aligned with each other, a chip test step is further implemented. The chip test step is implemented by moving a plurality of probes of the probe card to the chips according to the wafer coordinate information.

In certain embodiments, the chip has a plurality of first bonding pads disposed on a surface of the chip, and the wafer coordinate information includes a plurality of coordinates of the first bonding pads on the wafer.

In certain embodiments, each of the first bonding pads has a probe needle region and a non-needle region, and the probes are respectively aligned with the probe needle regions of the first bonding pads.

In certain embodiments, each of the test keys has a plurality of second bonding pads, and the wafer coordinate information includes a plurality of coordinates of the second bonding pads on the wafer.

In certain embodiments, an area of the probe needle region is within a range from 10% to 50% of an area of the first bonding pads.

In certain embodiments, the step of determining that the two probes and the two test keys are aligned with each other further includes: making a physical contact between the two probes and the two test keys; and capturing and obtaining probe marks of the two probes on the two test keys from the image capture device.

Therefore, one of the beneficial effects of the present disclosure is that the alignment method can confirm whether the probe is directly above the first bonding pads by comparing the wafer coordinate information with the actual information of the wafer, and then judge the positional relationship of the probe on the chip. When the probe is confirmed to be aligned directly over the first bonding pad, confirm the position of the second bonding pad located on the chip on the wafer to perform the chip test step by a coordinate relationship between the first bonding pad on the test keys and the second bonding pad on the wafer after the wafer is etched and formed. The alignment method of the present disclosure can not only effectively confirm the position of the second bonding pad of the wafer, reduce the misjudgment of the tester's eyesight, but also effectively reduce the scratches on the wafer and the resistance during wire bonding. In addition, the alignment method of the present disclosure can further use each of the test keys that have passed the wafer acceptance test as an alignment reference, so that the probe head can be effectively aligned and pinned to the probe needle region on the chip. Accordingly, the alignment method does not need to add additional auxiliary components on the wafer to save costs while improving the accuracy of the probe head.

In another aspect, the present disclosure provides an alignment device. The alignment device is used to perform alignment of a plurality of probes with a wafer that includes a plurality of chips. Any two of the chips adjacent to each other have a dicing road there-between, the dicing road has a plurality of test keys, and the wafer has wafer coordinate information. The alignment device includes a probe card and a processor. The probe card has a plurality of probes. At least two of probes are respectively aligned with one of the test keys located on two of the dicing roads. An image capturing device is configured to capture and obtain a relative position between the two of probes and two of the test keys. When two probes and the two test keys are aligned with each other, the processor instructs a plurality of probe heads of the probe card to move to the wafer according to the chips coordinate information.

In certain embodiments, the probe card performs wafer testing on the wafer.

Therefore, one of the beneficial effects of the present disclosure is that the alignment device can perform the above alignment method. Accordingly, the alignment device can not only effectively confirm the position of the second bonding pad of the wafer, reduce the misjudgment of the tester's eyesight, but also effectively reduce the scratches on the wafer and the resistance during wire bonding.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

An alignment method and an alignment device of the present disclosure are more particularly described in the following examples that are intended as illustrative only since numerous modifications and variation therein will be apparent to those skilled in the art. Those skilled in the art can understand the advantages and effects of the present disclosure from the content disclosed in this specification. The present disclosure can be implemented or applied through other different specific embodiments, and various details in this specification can also be modified and changed based on different viewpoints and applications without departing from the concept of the present disclosure. In addition, it is stated in advance that the accompanying drawings of the present disclosure are merely schematic illustrations and are not drawn according to the actual size. The following embodiments will further describe the related technical content of the present disclosure in detail, but the disclosed content is not intended to limit the protection scope of the present disclosure. In addition, the term "or", as used herein, should include any one or a combination of more of the associated listed items, as the case may be.

Figure 1:
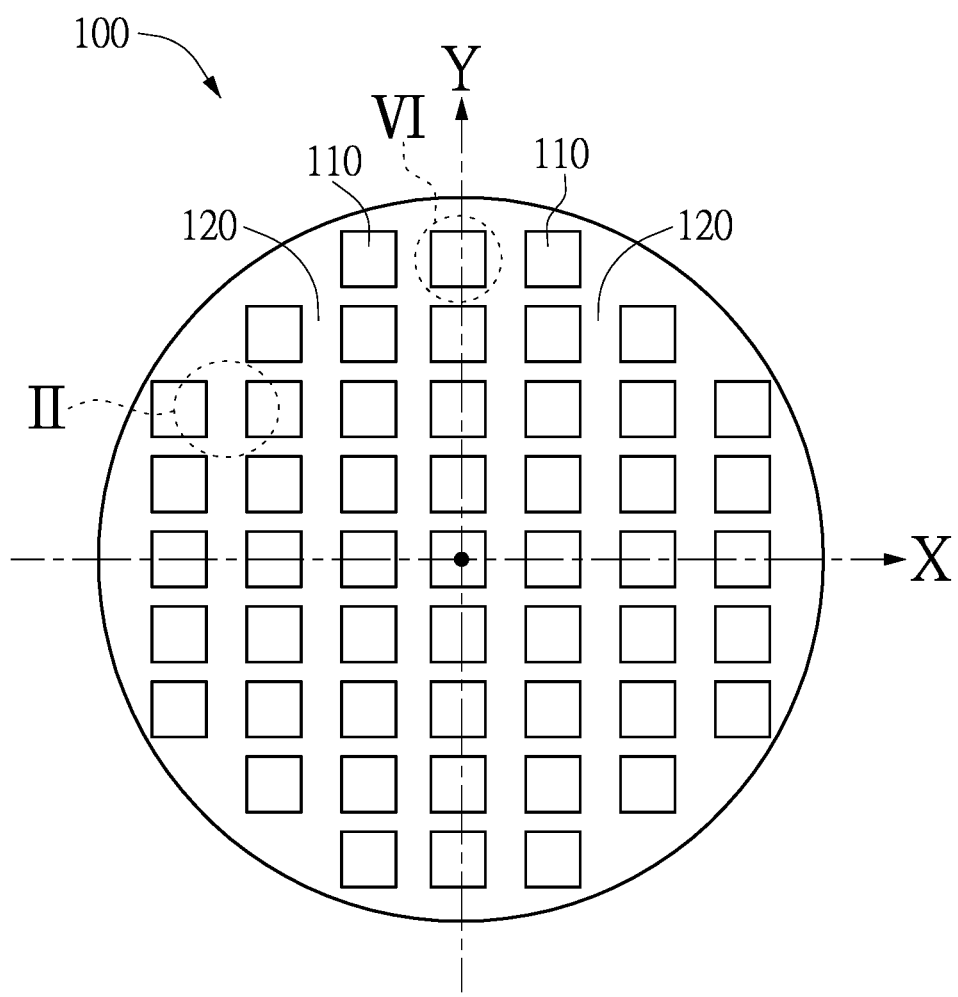
FIG. 1 is a schematic top view of a chip according to one of embodiments of the present disclosure.
Figure 2:
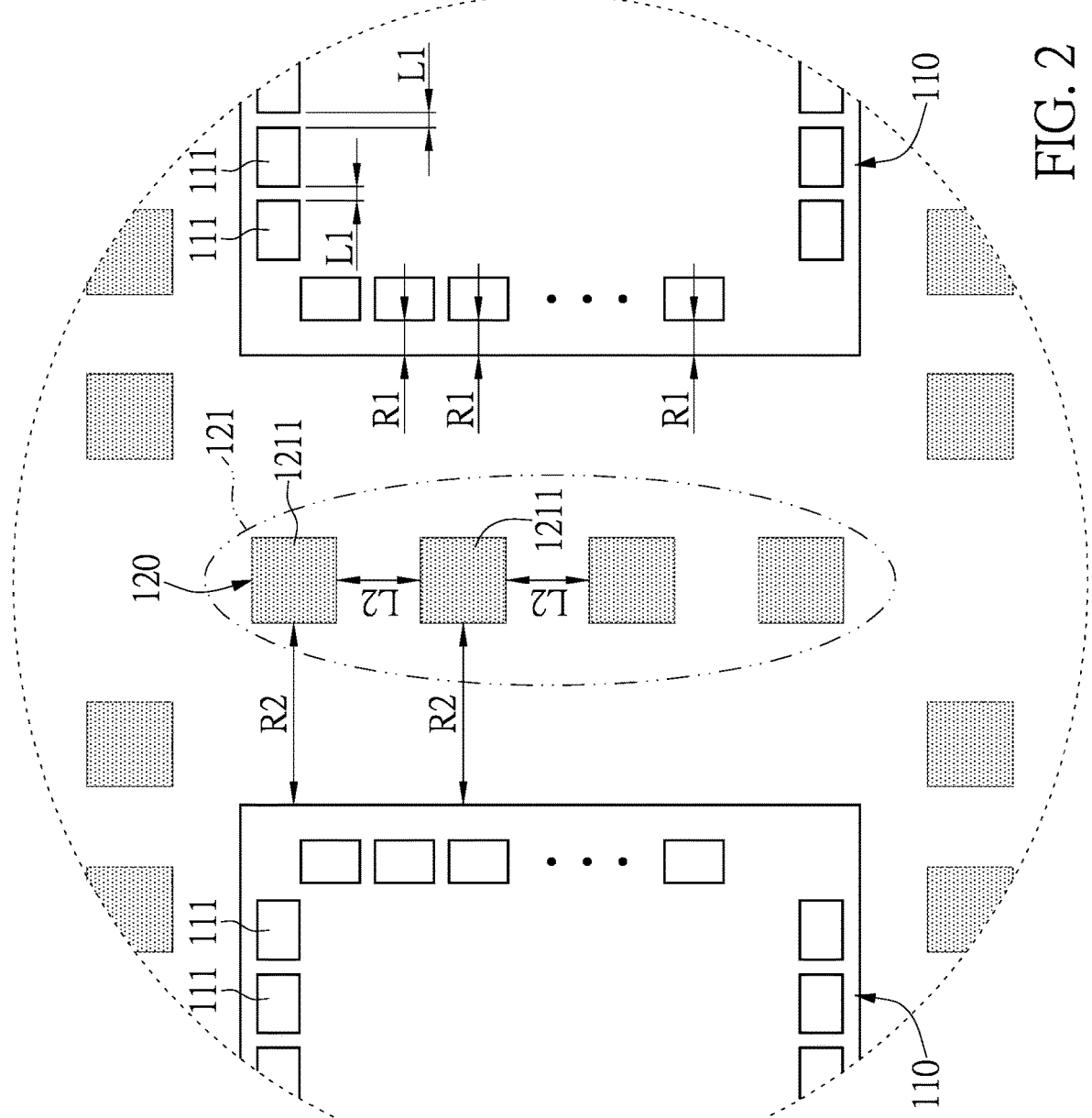
FIG. 2 is a schematic enlarged view of part II of FIG. 1.
Figure 3:
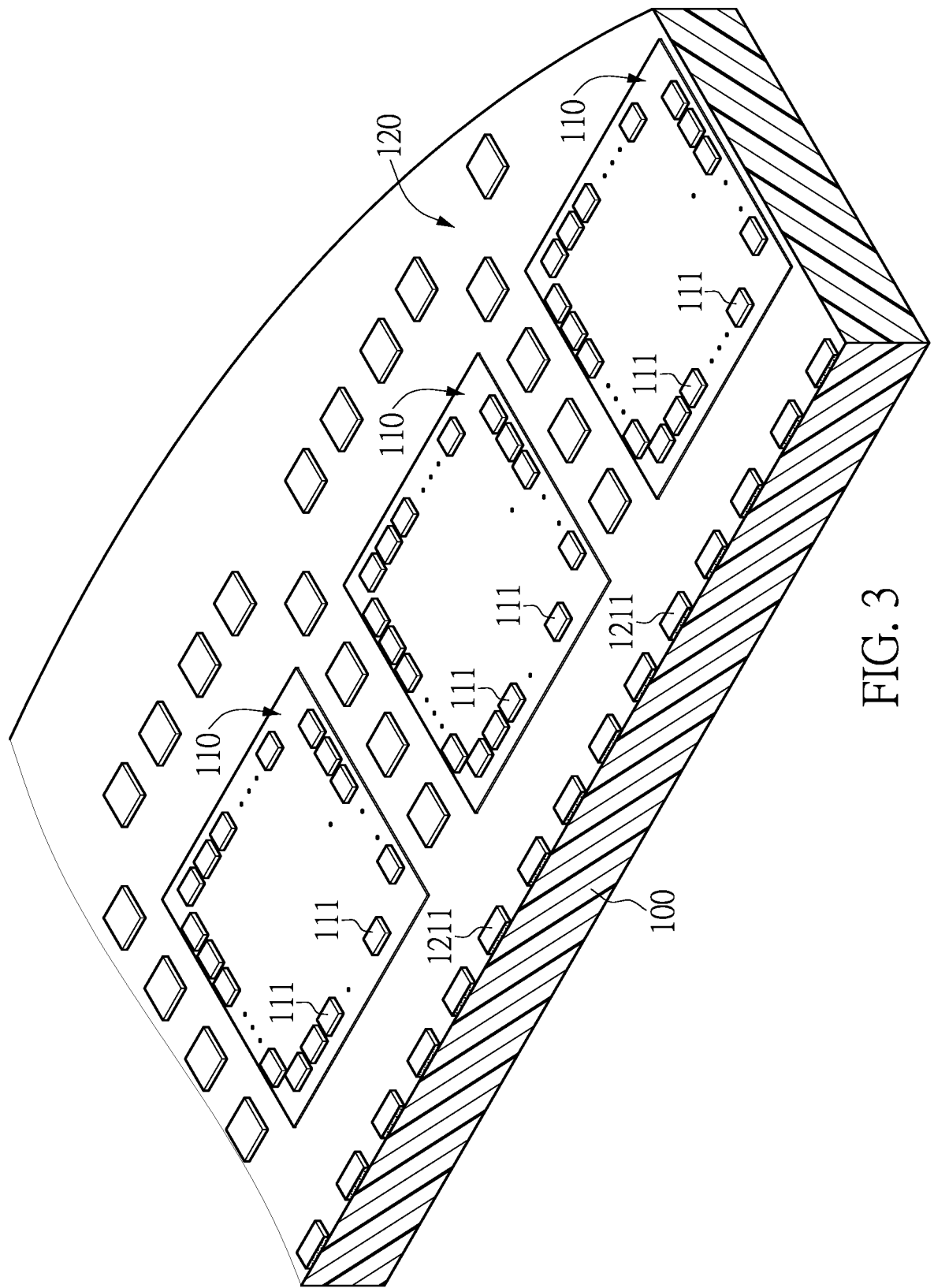
FIG. 3 is a schematic perspective cross-sectional view of a part of the chip according to one of embodiments of the present disclosure.

In the embodiment of the present disclosure, as shown in FIG. 1, FIG. 2, and FIG. 3, a wafer 100 has a plurality of dicing roads 120, and each of the dicing roads has a plurality of test keys 121. The test keys 121 are used for wafer acceptance test (WAT), and each of the test keys 121 has at least two second bonding pads 1211. The test keys 121 are present on the dicing road 120 before the wafer process, and the arrangement of the second bonding pads 1211 on the dicing roads 120 is determined before the wafer process. The present disclosure is not limited to the arrangement of the second bonding pads 1211, so each of the second bonding pads 1211 on the dicing roads 120 may be arranged in an equidistant arrangement or an unequal arrangement.

In addition, in practice, the test keys 121 are usually designed with many components, such as a N-Metal-Oxide-Semiconductor (NMOS), a positive channel Metal Oxide Semiconductor (PMOS), a transistor, a resistor, a capacitor, a memory unit, a ring oscillator, etc., but the present disclosure is not limited to the test keys 121.

In some embodiments, when the second bonding pads 1211 are arranged in the equidistant arrangement, any two of the second bonding pads 1211 adjacent to each other have a second fixed distance L2 there-between, and each of the second bonding pads 1211 and the chips 110 adjacent to sides thereof have a second distance R2 there-between.

Figure 6:
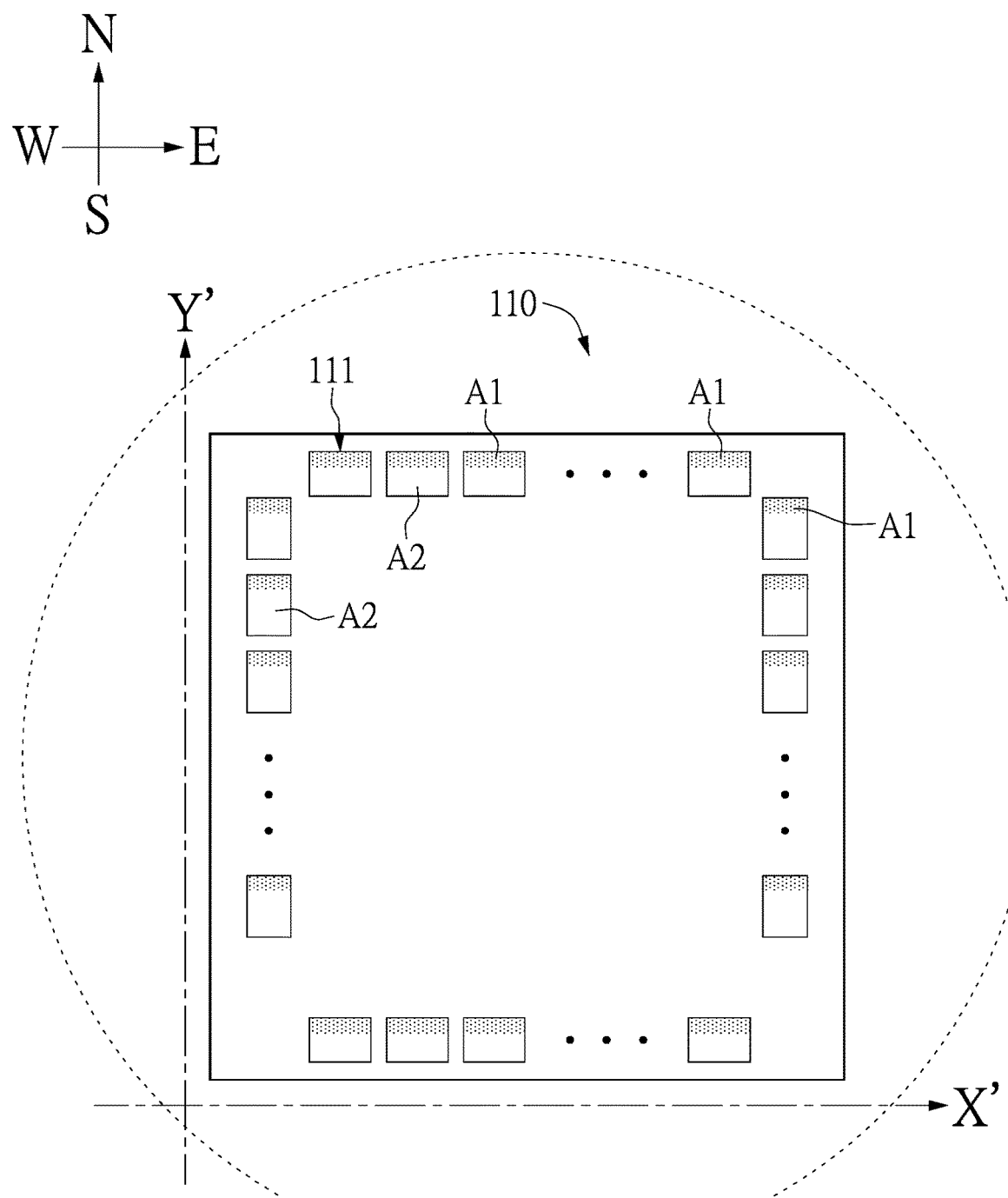
FIG. 6 is a schematic top view of the probe card for electrical testing of the first bonding pad according to the present disclosure.

For a description of the wafer coordinate information, please refer to FIG. 1, FIG. 3 and FIG. 6. The wafer 100 has a wafer coordinate system, and the wafer coordinate system is determined before the wafer process. The wafer coordinate system has a lateral direction (i.e., a X-axis direction in FIG. 1) and a length direction (i.e., a Y-axis direction in FIG. 1). A position of each of the chips 110 and the test keys 121 is defined on the wafer coordinate system. For example, a coordinate of a point where the X-axis and the −Y axis intersect is ($X_0$, $Y_0$) (not shown). Therefore, each of the chips 110 and the test keys 121 on the wafer 100 have a specific point coordinate. In addition, referring to FIG. 6, each of the chips 100 has a chip coordinate system, and the chip coordinate system is determined before the wafer process. The chip coordinate system has a lateral direction (i.e., a X'-axis direction in FIG. 6) and a length direction (i.e., a Y'-axis direction in FIG. 6). A position of each of first bonding pads 111 on the chip 110 is defined on the chip coordinate system.

First Embodiment

Referring to FIG. 1 to FIG. 4, when the wafer 100 passes the wafer acceptance test before the process is completed, the wafer 100 passing the test conditions is sent to the next process to start the manufacturing of the wafer 110. The wafer 100 includes one or more chips 110, and each of the chips 110 has a plurality of first bonding pads 111 on a surface thereof, and the first bonding pads 111 are used for wire bonding to connect the chips and a lead frame (not shown in the figure) with a metal wire. Each of the first boding pads 111 on the chips may be arranged in an equidistant arrangement or an unequal arrangement. When the chip 110 is manufactured, the arrangement of the first bonding pads 111 on the chip 110 is determined, so the present disclosure is no limited to the arrangement of the first bonding pads 111. When the first bonding pads 111 are arranged in the equidistant arrangement, any two of the first bonding pads 111 adjacent to each other have a first fixed distance L1 there-between, and each of the first bonding pads 1211 and an edge of one of the chips 110 adjacent to sides thereof have a first distance R1 there-between (as shown in FIG. 2).

Figure 4:
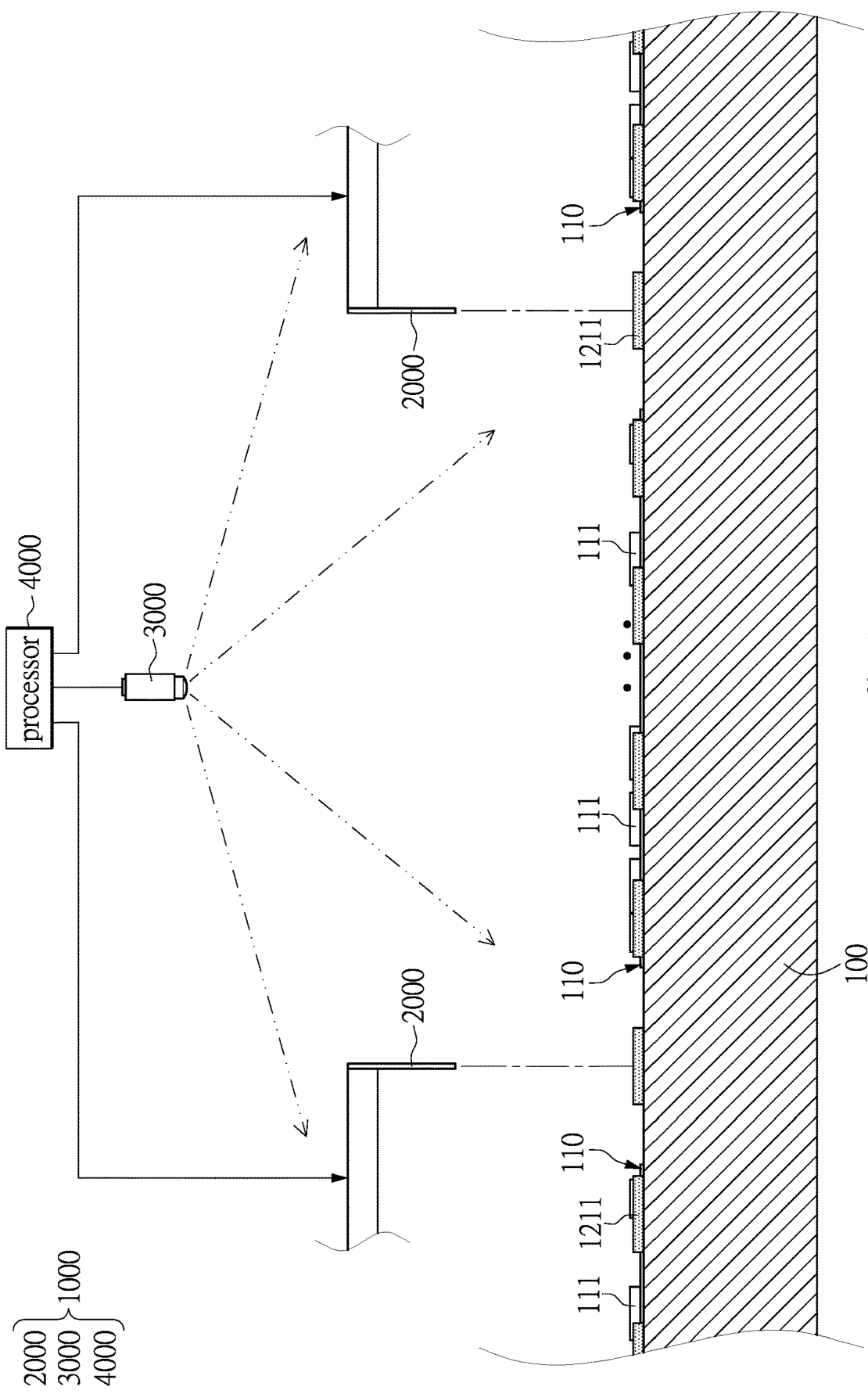
FIG. 4 is a schematic cross-sectional view of two probes and an image capture device that are aligned above the wafer according to one of embodiments of the present disclosure.

Referring to FIG. 4, a first embodiment of the present disclosure provides an alignment device 1000. The alignment device 1000 includes at least two of probes 2000, an image capture device 3000, and a processor 4000. The alignment device 1000 is used to confirm the position of at least one of the chips 110 on the wafer 100. The two probes 2000 and the image capture device 3000 are both electrically connected to the processor 4000. Wafer coordinate information can be pre-stored in the processor 4000 to determine the coordinate position of each of components on the wafer, that is, the wafer coordinate system and the chip coordinate system. The wafer coordinate information such as a size of the wafer, a width of the dicing road, a size of the chip, a position of the chip, a position of a welding point on the chip, a size of the test key, a position of the test key, but the present disclosure is not limited thereto. The wafer coordinate information records the coordinates of each of the chips 110 and the test keys 121 on the wafer 100, and the coordinates of each of the first bonding pads 111 on the chips 110, and the coordinates of the second bonding pads 1211 on the test keys 121. The wafer coordinate information also includes the relative positions between the test keys.

Figure 5:
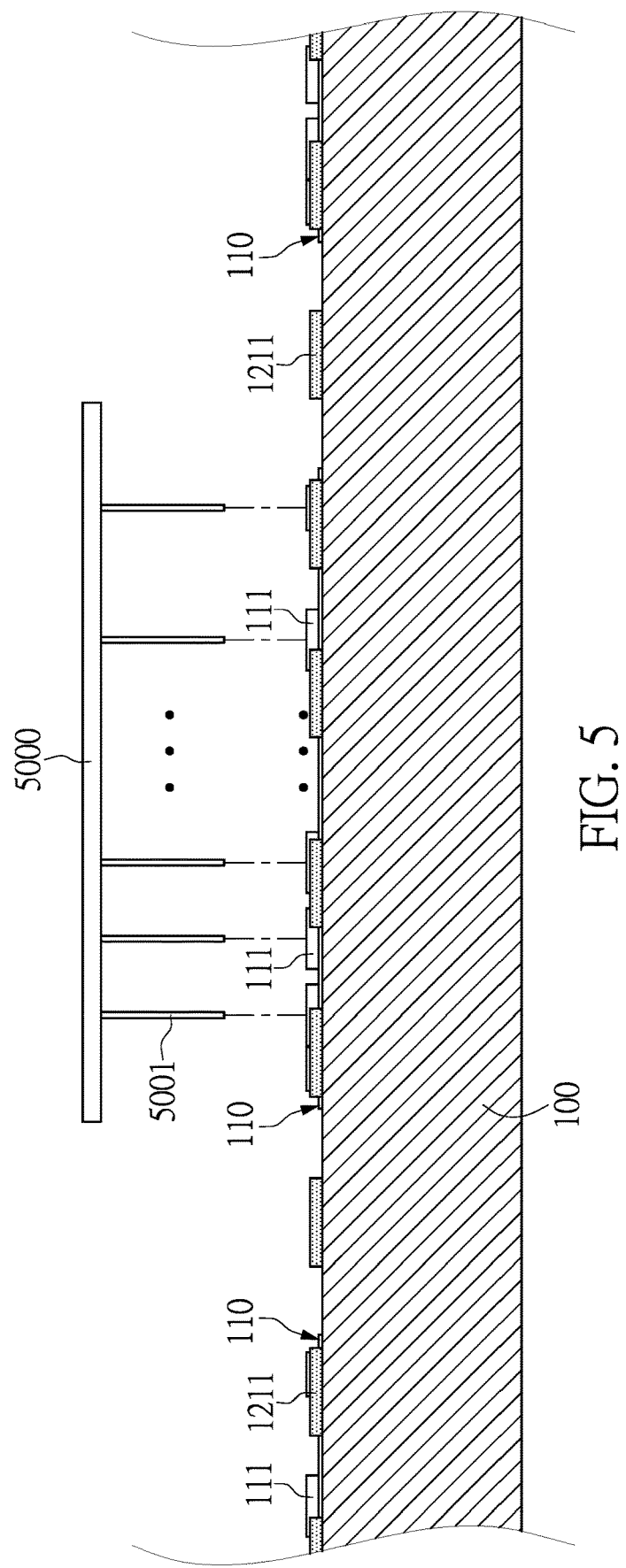
FIG. 5 is a schematic view of a probe card for electrical testing of wafer-on-wafer according to the present disclosure.

Furthermore, as shown in FIG. 5, the alignment device 1000 may further include a probe card 5000, and the probe card 5000 is used to perform a wafer test on the chips 110 to confirm whether the first bonding pads 111 on the chip 110 can be electrically connected to the metal wire.

The positions of the test keys 121 and the second bonding pads 1211 on the wafer 100 are known before the wafer process is completed. After the chips 110 is manufactured, the arrangement of the first bonding pads 111 on the chips 110 and the positions of the chips 110 on the wafer 100 are also known. Therefore, the coordinates of each of the chips 110 and the test keys 121 on the wafer 100, the coordinates of each of the first bonding pads 111 on the chips 110 and the coordinates of the second bonding pads 1211 on the test keys 121 are also known.

Second Embodiment

Figure 7:
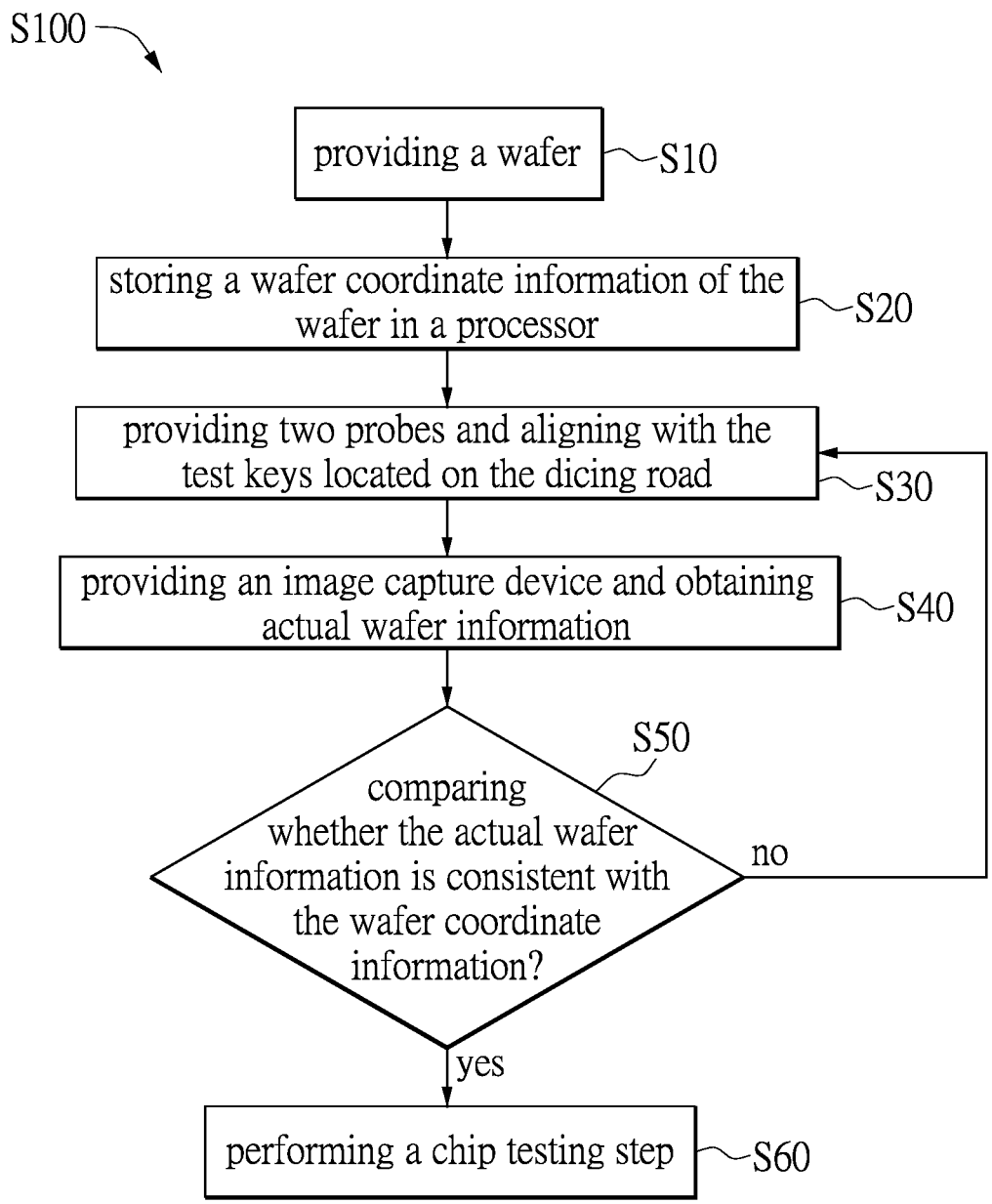
FIG. 7 is a flowchart of an alignment method S100 according to the present disclosure.

Referring to FIG. 7, FIG. 7 is a flowchart of the alignment device 1000 executing an alignment method S100. The alignment method S100 includes the following steps.

A step S10 is implemented by providing a wafer 100. The wafer 100 has wafer coordinate information.

A step S20 is implemented by storing the wafer coordinate information of the wafer 100 in a processor 4000 for subsequent comparison. In addition, when the wafer coordinate information has been stored in the processor 4000 in advance, the step S20 can be omitted.

A step S30 is implemented by providing two probes 2000. The two probes 2000 can be respectively aligned with the test keys 121 located on the dicing road 120. More precisely, the two probes 2000 are capable of aligning the second bonding pads 1211 on any two of the test keys 121, respectively. In addition, the two probes 2000 may also be paired with any two of the second bonding pads 1211 located on the same test key 121 as required by the situation. The two probes 2000 can selectively contact any two of the second bonding pads 1211, or only directly above the second bonding pads 1211.

Furthermore, in the step S30, when the two probes 2000 are respectively aligned with the second bonding pads 1211 located on the two test keys 121, the image capturing device 3000 can capture images to assist the alignment, or the probe 2000 can touch down the test keys 121 to determine whether the probes 2000 are aligned above the second bonding pads 1211 by means of scratches generated on the test keys 121 after the probes 2000 touch down.

In a step S40, when two of the probes 2000 are aligned with any two of the test keys 121, the image capture device 3000 obtains actual wafer information by capturing the relative positions of the two probes 2000 directly above the wafer 100 and the relative positions of the two probes 2000 and a body of the wafer 100 on the same plane. The actual wafer information records the relative positions of any two of the test keys 121 on the wafer 100.

In a step S50, the actual wafer information captured by the image capture device 3000 will be sent to the processor 4000 and compared with the wafer coordinate information to help confirm whether the two probes 2000 are aligned directly above the two test keys 121. When the actual wafer information is consistent with the wafer coordinate information, it is determined that the relative positions of any two of the probes 2000 on any two of the test keys 121 on the wafer 100 are consistent with the wafer coordinate information including the coordinates on the test keys 121 and is determined the position of a particular one of the chips 110 on the wafer 100. More precisely, when the actual wafer information is consistent with the wafer coordinate information, it means that the two probes 2000 are located directly above the two test keys 121, respectively, which means that the positions of the two test keys 121 on the wafer 100 are confirmed. That is to say, it is to confirm the positions of the two second bonding pads 1211 on the wafer 100. The coordinates of the first bonding pads 111, the second bonding pads 1211, and the chips 110 on the wafer 100 have already been determined after the semiconductor etching. Therefore, when the positions of the two test keys 121 on the wafer are known, the positions of the first bonding pads 111, the second bonding pads 1211, and the chips 110 on the wafer 100 can be determined by the relative positions among the first bonding pads 111, the second bonding pads 1211, and the chips 110.

Furthermore, in the step S50, in the process of comparing whether the actual wafer information is consistent with the wafer coordinate information, the two probes 2000 can confirm that they are located directly above the two second bonding pads 1211 by comparing whether the relative positions of the second bonding pads 1211 included in the actual wafer information match the actual positions of the second bonding pads 1211 included in the wafer coordinate information.

When the actual wafer information does not match the wafer coordinate information, it means that the two probes 2000 are not located directly above the two test keys 121, respectively. Therefore, the step S30 will be re-executed, so that the two probes 2000 are re-aligned and located directly above any two of the test keys 121, until the actual wafer information and wafer coordinate information are consistent.

In a step S60, after the comparison between the actual wafer information and the wafer coordinate information is completed, a chip testing step may be implemented to determine whether the first bonding pads 111 on the chips 110 can be electrically connected to the metal wires. However, the step S60 can also be omitted according to actual requirements.

Referring to FIG. 5, and FIG. 7, when the step S60 is implemented, the probe card 5000 may only contact a part of a surface of the chip 110. To be more precise, each of the probe heads 5001 of the probe card 5000 will only contact a probe needle region A1 on each of the chips 110, while a rest of each of the chips 110 is a non-needle region A2. The non-needling area A2 can be used for subsequent wire bonding, and can also be used for other purposes.

The position of the probe needle region A1 on each of the chips is fixed, so the scratches caused by the test can be limited to the probe needle region A1. For example, as shown in FIG. 6, the probe needle region A1 is formed with an offset on each of the first bonding pads 111. Preferably, an area occupied by the probe needle region A1 on the first bonding pads 111 is within a range from 10% to 50%. For example, an offset side of the probe needle region A1 is located on a N side of the chip, and the probe needle region A1 may also be located on the a S/W/E side of the chip 110 according to actual requirements. As required by the situation, the present disclosure is not limited to the position of the offset side of the probe needle region A1 on the chip 110. Accordingly, a single one of the chips 110 can not only be effectively aligned to determine each of the probe needle regions A1, but also each of the chips 110 can be wire-bonded.

Beneficial Effects of the Embodiments

In conclusion, one of the beneficial effects of the present disclosure is that the alignment method can confirm whether the probe is directly above the first bonding pads by comparing the wafer coordinate information with the actual information of the wafer, and then judge the positional relationship of the probe on the chip. When the probe is confirmed to be aligned directly over the first bonding pad, confirm the position of the second bonding pad located on the chip on the wafer to perform the chip test step by a coordinate relationship between the first bonding pad on the test keys and the second bonding pad on the wafer after the wafer is etched and formed. The alignment method of the present disclosure can not only effectively confirm the position of the second bonding pad of the wafer, reduce the misjudgment of the tester's eyesight, but also effectively reduce the scratches on the wafer and the resistance during wire bonding.

In addition, the alignment method of the present disclosure can further use each of the test keys that have passed the wafer acceptance test as an alignment reference, so that the probe head can be effectively aligned and pinned to the probe needle region on the chip. Accordingly, the alignment method does not need to add additional auxiliary components on the wafer to save costs while improving the accuracy of the probe head.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

Although the present disclosure has been specifically described above with reference to the accompanying drawings and embodiments, it should be understood that the above description is not limited to the present disclosure in any form. Those skilled in the art can make modifications and changes of the present disclosure as required without departing from the essential spirit and scope of the present disclosure, and these modifications and changes all fall within the scope of the present disclosure.

What is claimed is:

1. An alignment method for performing alignment of a plurality of probes with a wafer that includes a plurality of chips, wherein any two of the chips adjacent to each other have a dicing road there-between, the dicing road has a plurality of test keys, and the wafer has wafer coordinate information, the alignment method comprising:
   providing a probe card having at least two probes; wherein two probes are configured to respectively align one of the test keys located on any two of dicing roads; and
   providing an image capture device to capture and obtain relative positions between the two probes and two of the test keys;
   wherein, when the two probes and the two test keys are determined to be aligned with each other, a chip test step is further implemented; wherein the chip test step is implemented by moving a plurality of probes of the probe card to the chips according to the wafer coordinate information,
   wherein the chip has a plurality of first bonding pads disposed on a surface of the chip,
   wherein each of the first bonding pads has a probe needle region and a non-needle region, and the probes are respectively aligned with the probe needle regions of the first bonding pads.

2. The alignment method according to claim 1, wherein the wafer coordinate information includes a plurality of coordinates of the first bonding pads on the wafer.

3. The alignment method according to claim 1, wherein each of the test keys has a plurality of second bonding pads, and the wafer coordinate information includes a plurality of coordinates of the second bonding pads on the wafer.

4. The alignment method according to claim 1, wherein an area of the probe needle region is within a range from 10% to 50% of an area of the first bonding pads.

5. The alignment method according to claim 1, wherein, the step of determining that the two probes and the two test keys are aligned with each other further includes:
   making a physical contact between the two probes and the two test keys; and
   capturing and obtaining probe marks of the two probes on the two test keys from the image capture device.

6. An alignment device for performing alignment of a plurality of probes with a wafer that includes a plurality of chips, wherein any two of the chips adjacent to each other have a dicing road there-between, the dicing road has a plurality of test keys, and the wafer has wafer coordinate information, the alignment device comprising:
   a probe card having a plurality of probes; wherein at least two of probes are respectively aligned with one of the test keys located on two of the dicing roads;

an image capturing device for capturing and obtaining relative positions between the two of probes and two of the test keys; and a processor;

wherein, when two probes and the two test keys are aligned with each other, the processor instructs a plurality of probe heads of the probe card to move to the wafer according to the chips coordinate information, wherein the chip has a plurality of first bonding pads disposed on a surface of the chip, wherein each of the first bonding pads has a probe needle region and a non-needle region, and the probes are respectively aligned with the probe needle regions of the first bonding pads.

7. The alignment device according to claim 6, wherein the probe card performs wafer testing on the wafer.

* * * * *